DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED MAY 6, 1975

934 OG 9

T934,003

HETEROJUNCTION SWITCHING AND MEMORY DEVICE

Harold J. Hovel, Putnam Valley, N.Y., assignor to International Business Machines Corporation, Armonk, N.Y.

Continuation of application Ser. No. 242,145, Apr. 7, 1972, which is a continuation-in-part of application Ser. No. 46,943, June 17, 1970. This application Feb. 11, 1974, Ser. No. 441,712

Int. Cl. H03k *17/56, 17/70*
U.S. Cl. 357—16

2 Sheets Drawing. 38 Pages Specification

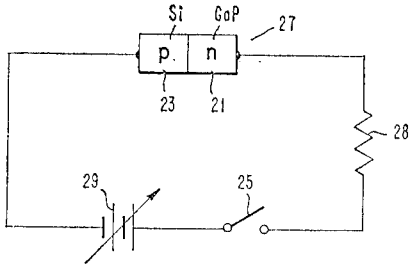

Figure 1:
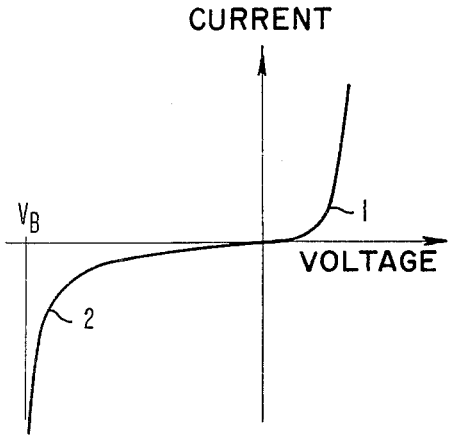
Figure 2:
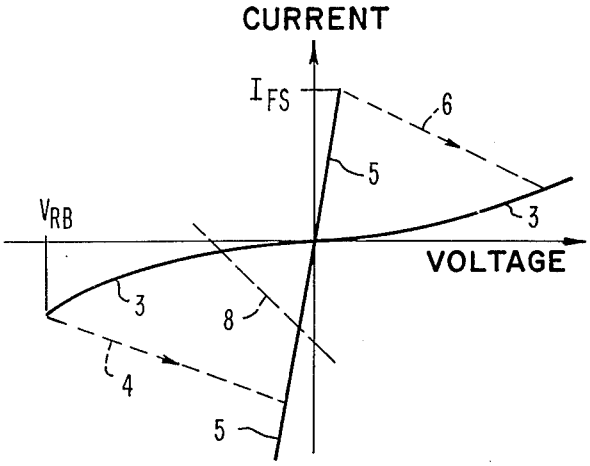
Figure 3:
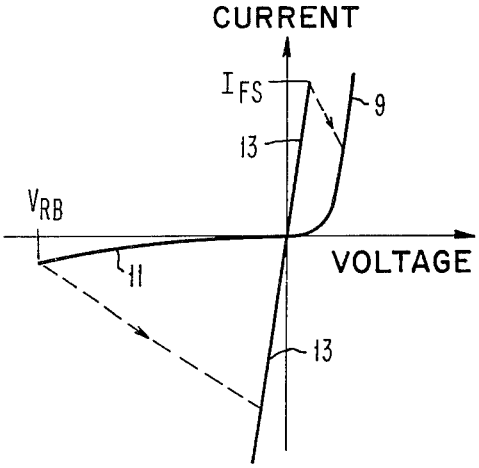
Figure 4:
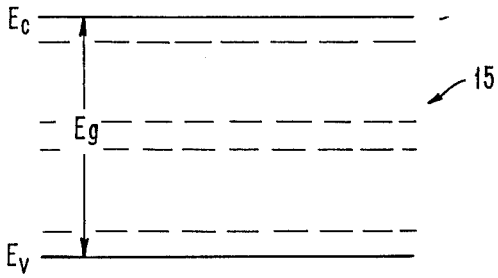
Figure 5:
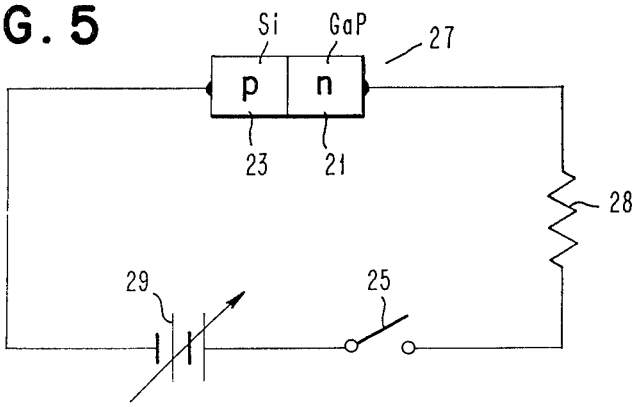
Figure 6:
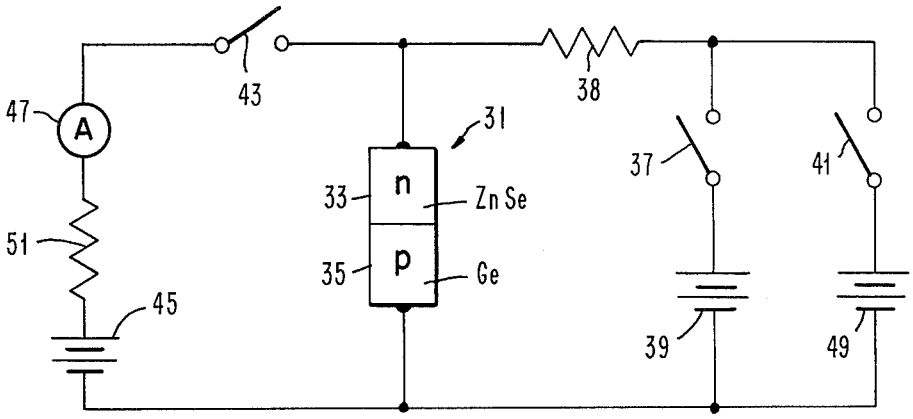
Figure 7:
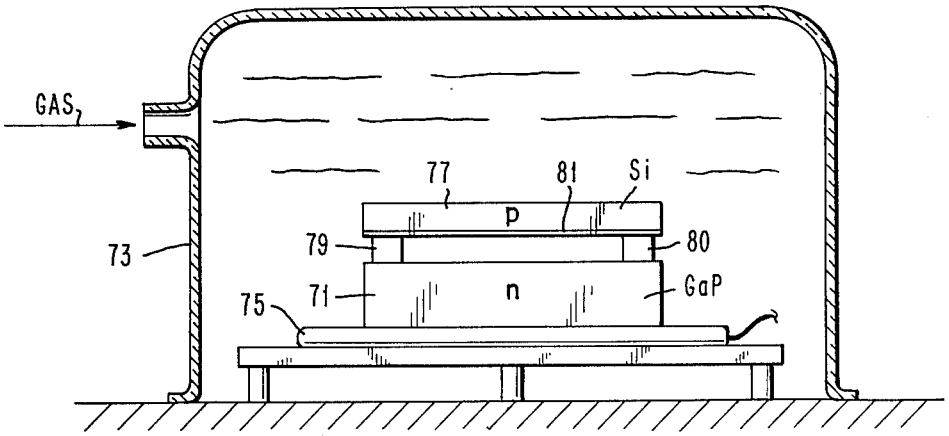
Figure 8:
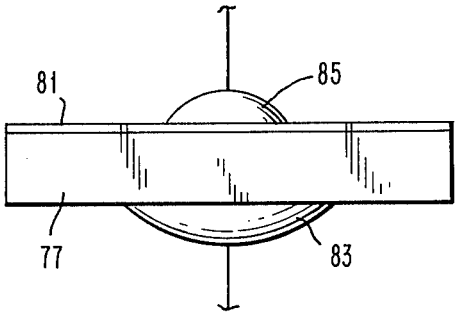

A bistable switching and non-volatile memory device which may be read either destructively or non-destructively is provided, as shown in FIG. 5, using a heterojunction consisting of a heavily doped, single crystal, semiconducting material in electrical and mechanical contact with a different, high resistivity, semiconducting material. The heterojunction exhibits stable high and low impedance states, as shown for example in FIG. 2, due to a high density of material imperfections, including deep energy "traps," both at the heterojunction interface and in the high resistivity grown region. The density of material imperfections including double or more acceptor-like traps may be of the order of $10^{-18}cm^{-3}$ or greater.

HETEROJUNCTION SWITCHING AND MEMORY DEVICE

Original Filed April 7, 1972 2 Sheets-Sheet 1

ENERGY BAND DIAGRAM

INVENTOR
HAROLD J. HOVEL

BY John A. Jordan
ATTORNEY